United States Patent
Sinclair et al.

(10) Patent No.: US 8,032,852 B1
(45) Date of Patent: Oct. 4, 2011

(54) METHOD OF AUTOMATING CLOCK SIGNAL PROVISIONING WITHIN AN INTEGRATED CIRCUIT

(75) Inventors: Martin Sinclair, Eskbank (GB); Nathan A. Lindop, Musselburgh (GB); Gareth D. Edwards, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 644 days.

(21) Appl. No.: 12/140,506

(22) Filed: Jun. 17, 2008

(51) Int. Cl.
*G06F 17/50* (2006.01)

(52) U.S. Cl. .......................... 716/116; 716/122; 716/126

(58) Field of Classification Search ............ 716/1, 8–14, 716/16, 17, 100, 126, 128, 129, 130, 137, 716/122; 713/500, 502; 327/116, 121, 291, 327/293
See application file for complete search history.

(56) References Cited

U.S. PATENT DOCUMENTS

| | | | |
|---|---|---|---|
| 5,717,942 | A | 2/1998 | Haupt et al. |
| 6,028,446 | A | 2/2000 | Agrawal et al. |
| 6,195,774 | B1 | 2/2001 | Jacobson |
| 6,647,508 | B2 | 11/2003 | Zalewski et al. |
| 6,766,389 | B2 | 7/2004 | Hayter et al. |
| 6,857,110 | B1 | 2/2005 | Rupp et al. |
| 7,028,270 | B1 | 4/2006 | Lam et al. |
| 7,235,999 | B2 | 6/2007 | Goetting et al. |
| 7,337,422 | B1 | 2/2008 | Becker et al. |
| 7,389,489 | B1 | 6/2008 | Chesal et al. |
| 7,552,415 | B2 | 6/2009 | Sanchez et al. |
| 7,594,211 | B1 | 9/2009 | Tian et al. |
| 2005/0094446 | A1* | 5/2005 | Terazawa et al. ............ 365/200 |
| 2005/0169318 | A1* | 8/2005 | Minemura et al. ........... 370/503 |
| 2008/0244491 | A1* | 10/2008 | Ganesan et al. ................ 716/10 |

OTHER PUBLICATIONS

U.S. Appl. No. 12/186,414, filed Aug. 5, 2008, Martin et al.
U.S. Appl. No. 12/329,881, filed Dec. 8, 2008, Sinclair.

* cited by examiner

*Primary Examiner* — Vuthe Siek
(74) *Attorney, Agent, or Firm* — Michael T. Wallace; LeRoy D. Maunu

(57) ABSTRACT

A method is provided to incorporate information currently known about an integrated circuit's design, including peripheral components that share the same printed circuit board (PCB) with the integrated circuit, to automate a clock signal instantiation and routing solution to realize a comprehensive design. The information derived from a hardware design synthesis tool includes the existence of PCB resources, such as fixed-frequency oscillators, that may co-exist with a particular integrated circuit, such as a programmable logic device (PLD). Other derived information includes details concerning clock modules and cores that may exist within the PLD in accordance with the PLD's design specification. Once the information that describes the PLD and its environment is known, the information is utilized to automatically instantiate resource interconnect cores and automatically generate connections between the fixed-frequency oscillators, resource interconnect cores, and PLD implemented cores that are contained within the design.

18 Claims, 8 Drawing Sheets

METHOD OF AUTOMATING CLOCK SIGNAL PROVISIONING WITHIN AN INTEGRATED CIRCUIT

FIELD OF THE INVENTION

The present invention generally relates to clock signal provisioning, and more particularly to a method for automatically provisioning clock signals within an integrated circuit.

BACKGROUND OF THE INVENTION

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells during a configuration event that defines how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these PLDs, the functionality of the device is controlled by configuration data bits provided to the device for that purpose. The configuration data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration data bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Generally, clock modules are not instantiated within the cores, since such a design precludes the possibility of sharing clock modules between multiple cores that exist within the same clock domain. Instead, clock module instantiation and associated clock signal routing to each core within a particular design is considered to be a manual effort, since clock signal timing associated with many complicated designs is critical to the success of the designs. Clock signal skew, clock signal loading, etc., are some of the design considerations that are to be taken into account for any design that exhibits critical timing constraints.

The designer, therefore, manually instantiates clock modules in accordance with the design's clocking needs. In addition, the designer routes fixed-frequency oscillator output signals to the inputs of the instantiated clock modules and routes clock output signals from the instantiated clock modules to the clock input signals of the cores that are integrated within the design. In many instances, however, such a manual effort is simply not necessary, since the clock signal timing constraints for many designs are not critical. Efforts continue, therefore, to further automate the FPGA design process so that the designer may be relieved of manual clock signal design/distribution efforts for designs whose timing constraints are more relaxed.

SUMMARY OF THE INVENTION

To overcome limitations in the prior art, and to overcome other limitations that will become apparent upon reading and understanding the present specification, various embodiments of the present invention disclose a method for automating clock signal provisioning within an integrated circuit.

In accordance with one embodiment of the invention, a method of automating clock signal provisioning within an integrated circuit comprises gathering a first set of information associated with the integrated circuit, gathering a second set of information associated with an environment surrounding the integrated circuit, instantiating a first set of cores within the integrated circuit that are compatible with the first and second sets of information, routing interconnect between the environment, the first set of cores, and a second set of cores contained within the integrated circuit to supply clock signals to the second set of cores. The first set of cores being adapted to derive the clock signals that are compliant with clock signal requirements of the second set of cores.

In accordance with another embodiment of the invention, an automated clock signal provisioning system comprises a processor that is adapted to synthesize automatic clock signal routing within an integrated circuit. The processor is adapted to perform functions including gathering a first set of information associated with the integrated circuit, gathering a second set of information associated with an environment surrounding the integrated circuit and instantiating a first set of cores within the integrated circuit that are compatible with the first and second sets of information. The processor is further adapted to perform functions including routing interconnect between the environment, the first set of cores, and a second set of cores contained within the integrated circuit to supply clock signals to the second set of cores. The first set of cores is adapted to derive the clock signals that are compliant with clock signal requirements of the second set of cores.

In accordance with another embodiment of the invention, an automatic clock provisioning method comprises gathering information associated with an integrated circuit from description and constraint files contained within a hardware design synthesis tool that is utilized to synthesize the integrated circuit. The automatic clock provisioning method further comprises gathering information associated with an environment surrounding the integrated circuit from the description and constraint files, instantiating resource interconnect cores within the integrated circuit in response to the description and constraint files, and deriving clock signals within the instantiated resource interconnect cores that are compatible with other cores existing within the integrated circuit.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention provide a method whereby information that is currently known about an integrated circuit's design, including information known about peripheral components that share the same printed circuit board (PCB) with the integrated circuit, is utilized to automate a clock signal instantiation and routing solution to automatically realize a comprehensive design. Such information, for example, may be derived from hardware design synthesis tools that are concurrently used, for example, to verify a particular hardware design against a particular set of design rules.

The derived information includes the existence and location of peripheral components, such as fixed-frequency oscillators, that may co-exist with a particular integrated circuit, such as a programmable logic device (PLD), on the PCB. Other derived information includes details concerning clock modules and cores that may exist within the PLD in accordance with the PLD's design specification as defined by the PLD's hardware description language (HDL). Once the information that describes the PLD and its environment is known, the information is utilized to automatically generate connections between, for example, the PCB mounted fixed-frequency oscillators, PLD implemented clock modules, and PLD implemented cores that are contained within the design.

The environment description is generally known to the HDL development station at compilation time. As such, the PCB's description is known, the pin locations of any available clock signal outputs are known, and the frequency/phase information of the available clock signal outputs are also known. Such information is generally captured within constraint files that are stored within a data storage module that may be accessed by the HDL development station.

Similarly, each clock port of a PLD implemented core is identified, where the identifying information includes frequency, phase, stability, and other clock signal requirements that are associated with the core's description. The core's identifying information is generally captured within description files that are unique to the particular core being utilized within the PLD. Thus, the description files are not intrinsic to the HDL specification, which is to say that the core description files are not part of the HDL language specification.

Figure 1:
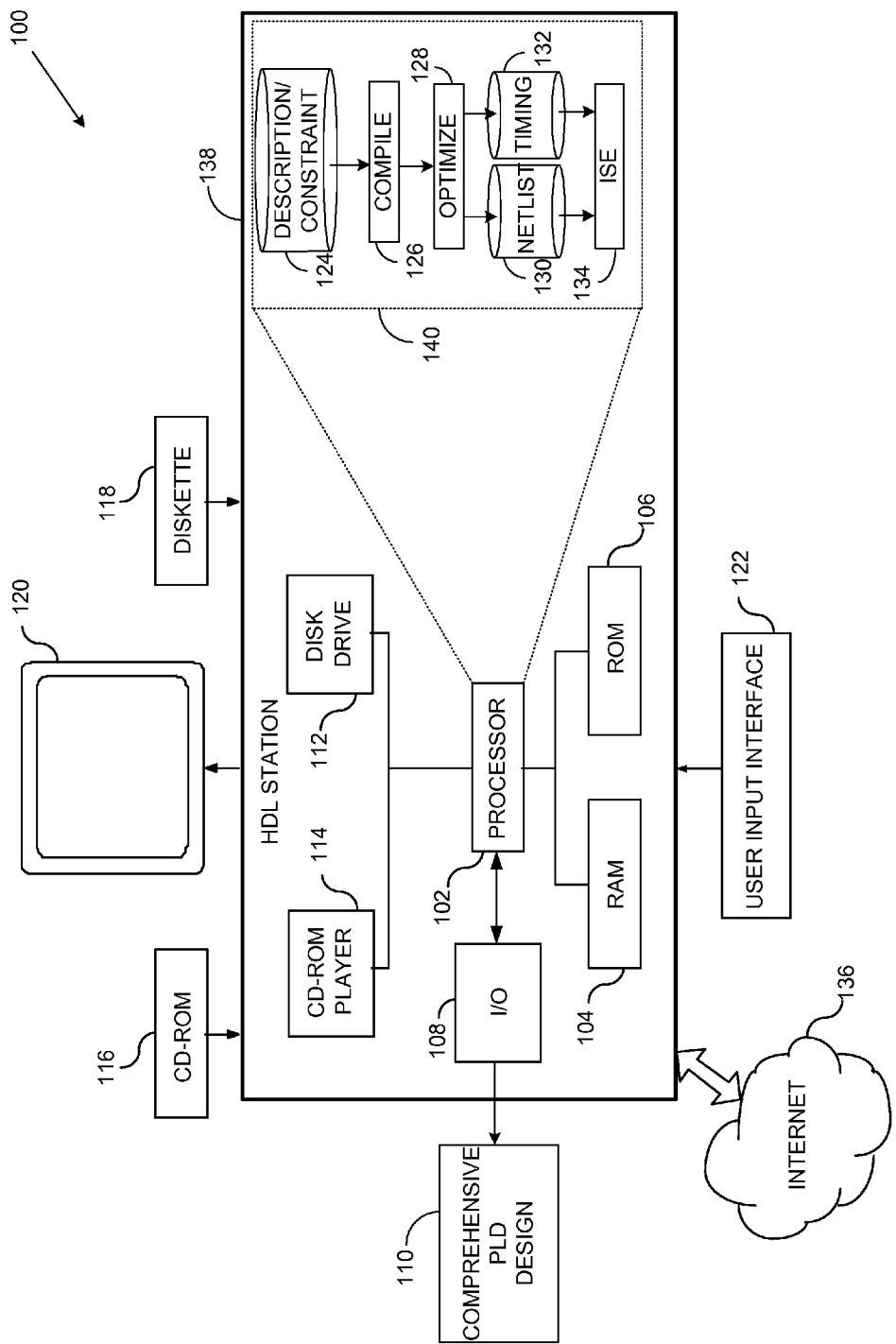
FIG. 1 illustrates an exemplary hardware description language (HDL) development station.

The provisioning of clock signals to the core(s) utilized within an integrated circuit, such as a PLD, may be realized by the designer at an HDL development station as exemplified in FIG. 1. Verilog and VHDL represent two of the more popular HDL languages in use today, which may be used to define the structure of a PLD based design. In particular, HDL facilitates a description of the manner in which a design is decomposed into sub-blocks of logic resources and further allows a description of the manner in which each sub-block of the design is to be interconnected.

The exemplary computing arrangement 100 that is suitable for performing HDL definition activities in accordance with the various embodiments of the present invention includes HDL station 138, which includes a central processor (CPU) 102 coupled to random access memory (RAM) 104 and read-only memory (ROM) 106. The ROM 106 may also be other types of storage media to store programs, such as programmable ROM (PROM), electronically erasable PROM (EEPROM), etc. The processor 102 may communicate with other internal and external components through input/output (I/O) circuitry 108 to provide, for example, a configuration bit stream to define the one or more PLDs that may exist within comprehensive PLD design 110.

As discussed in more detail below, comprehensive PLD design 110 incorporates board level knowledge, as known by HDL station 138, to automate the instantiation and interconnect of PLD resources, i.e., resource interconnect cores, within the PLD. Such resource interconnect cores aid in the automated incorporation of PCB level resources, such as fixed-frequency oscillators, to fulfill the clocking requirements of the core modules within the PLD. The resource interconnect core methodology may also be extended to incorporate other comprehensive design aspects, such as the coupled relationship that exists between clock and reset signals to facilitate synchronous resets, timing of reset periods, etc.

HDL station 138 may include one or more data storage devices, including hard and floppy disk drives 112, CD-ROM drives 114, and other hardware capable of reading and/or storing information such as a DVD, etc. Software for facilitating the comprehensive PLD design definitions in accordance with an embodiment of the present invention may be stored and distributed on a CD-ROM 116, diskette 118 or other form of media capable of portably storing information. These storage media may be inserted into, and read by, devices such as the CD-ROM drive 114, the disk drive 112, etc.

The software for facilitating the comprehensive PLD design definitions may also be transmitted to HDL station 138 via data signals, such as being downloaded electronically via a network, such as Internet 136. HDL station 138 is coupled to a display 120, which may be any type of known display or presentation screen, such as LCD displays, plasma displays, cathode ray tubes (CRT), etc. A user input interface 122 is provided, including one or more user interface mechanisms such as a mouse, keyboard, microphone, touch pad, touch screen, voice-recognition system, etc.

Processor 102 may be used to execute core synthesis tools 124-134 to aid in the minimization and optimization of the equations extracted from the HDL files. For example, description/constraint files 124 may provide, among other definitions, a description of the PCB upon which the PLD exists, the pin locations of any available clock signal outputs as may be provided by, e.g., fixed-frequency oscillators, and the frequency/phase information of such clock signal outputs. Description/constraint files 124 may also provide constraints, such as the frequency, phase, stability, and other clock signal requirements that are associated with the core's description as incorporated into the PLD definition. Compiler 124 parses through the HDL behavioral source code and description/constraint files 124 to extract known functions, e.g., arithmetic functions, multiplexers, memories, etc., as well as the known clocking resources within the comprehensive design that may aid in the automation of clock signal provisioning for the cores contained within the PLD definition.

Optimize block 128, net list 130, timing 132, and integrated software environment (ISE) block 134 each interoperate to formulate a design that is substantially dependent upon the intended PLD target's architecture and context. The context, for example, may influence inter-function optimizations such as replication, merging, re-timing, and pipelining. The context may be defined by the timing requirements and topology of the design. Once the design is synthesized, it may be realized within comprehensive PLD design 110, portions of which are exemplified by FIGS. 2-7 as discussed in more detail below.

Figure 2:
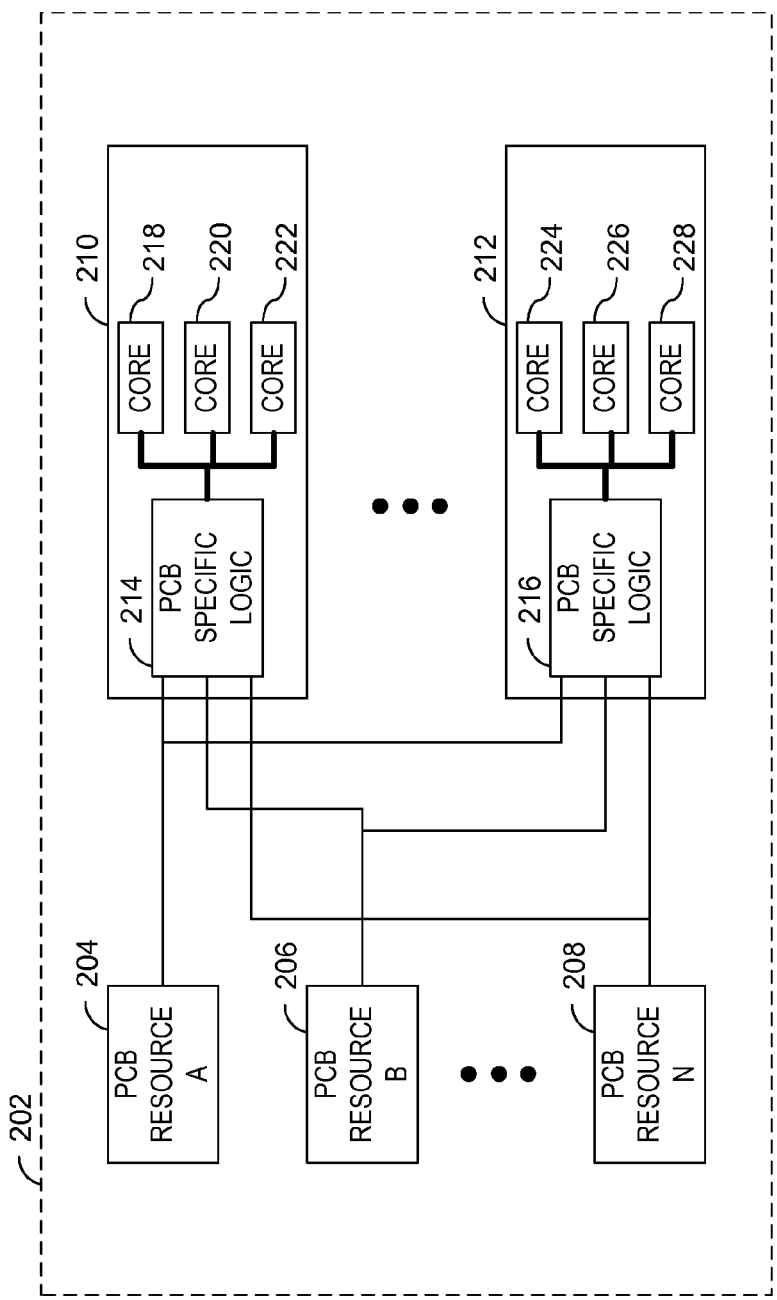
FIG. 2 illustrates a printed circuit board (PCB)-specific realization of a comprehensive programmable logic device (PLD) design in accordance with one embodiment of the present invention.

Turning to FIG. 2, a PCB-specific realization of a comprehensive PLD design is exemplified in accordance with one embodiment of the present invention. In particular, a single PCB-specific logic block 214-216 may be instantiated within each PLD 210-212, where each PCB-specific logic block 214-216 contains inputs that directly correlate to PCB resources 204-208, e.g., fixed-frequency oscillators, that are available on PCB 202. PCB-specific logic blocks 214-216, therefore, may be automatically implemented by synthesis tools 140 as HDL defined modules that are designed specifically for PCB 202. Since the external reference signals, as may be provided by PCB resources 204-208, are defined within constraint files 124 of FIG. 1, for example, the inputs of PCB-specific logic blocks 214-216 may be automatically instantiated and routed to accept the external reference signals that are provided by PCB resources 204-208.

Synthesis tools 140 may then interoperate to identify and route clock signals to the clock signal input pins associated with cores 218-228 that are not represented within netlist 130. That is to say, in other words, that all unconnected clock signal input pins associated with cores 218-228 are automatically routed to corresponding clock signal output pins associated with PCB-specific logic blocks 214-216. All clock signal input pins associated with cores 218-228 that are found to be connected, on the other hand, are ignored by synthesis tools 140.

For example, if cores 218-220 require a 100 MHz clock input signal, but are left unconnected, then a 100 MHz clock output signal is identified to exist within PCB-specific logic block 214 and is then automatically routed to the 100 MHz clock input signal pins of cores 218-220. Should cores 224 and 228 require a 125 MHz clock input signal, but are similarly left unconnected, then a corresponding 125 MHz clock output signal is identified to exist within PCB-specific logic block 216 and is then automatically routed to the 125 MHz clock input signal pins of cores 224 and 228. The clock signal input requirements of the remaining cores may be similarly fulfilled by the automatic identification and routing between PCB-specific logic blocks 214-216 and the corresponding cores.

Figure 3:
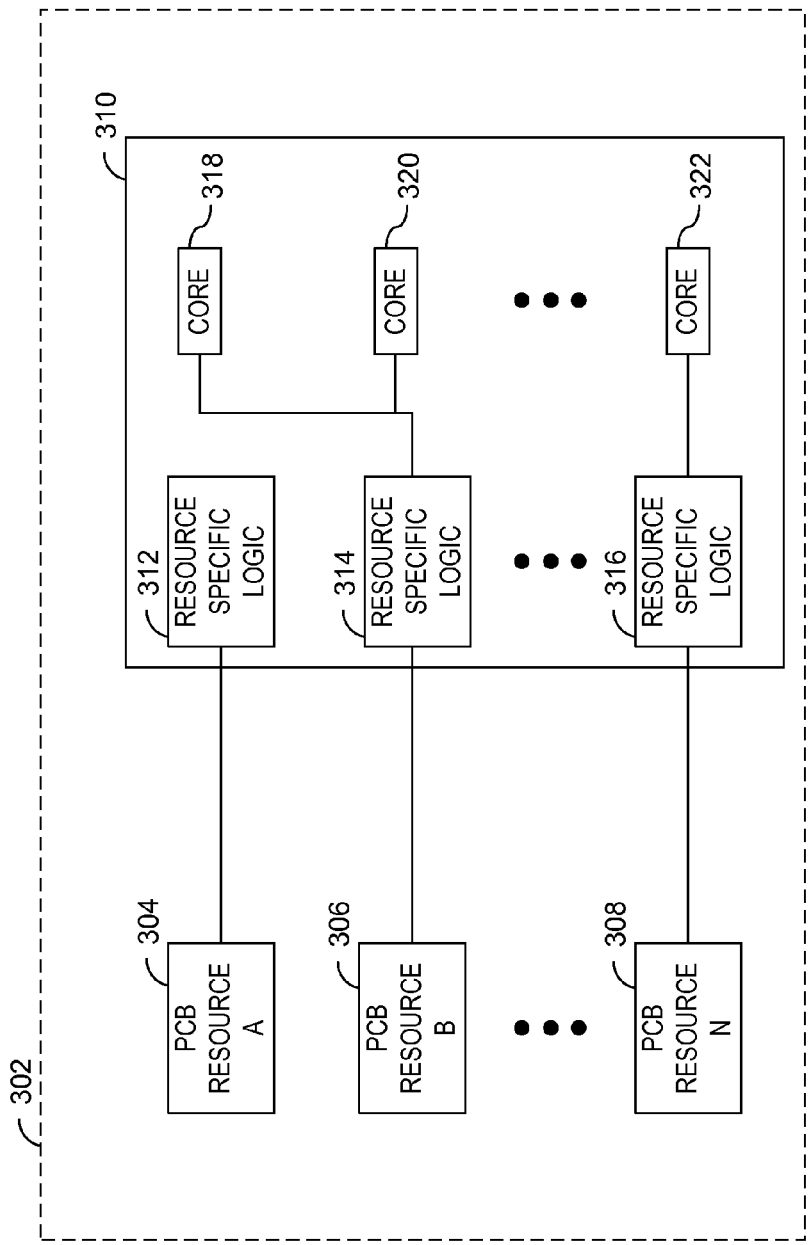
FIG. 3 illustrates an alternate embodiment of a PCB-specific realization of a comprehensive PLD design in accordance with the present invention.

Turning to FIG. 3, an alternate embodiment of a PCB-specific, comprehensive PLD design is exemplified in accordance with the present invention, whereby instead of the single PCB-specific logic blocks of FIG. 2, multiple logic blocks are automatically instantiated within each PLD 310. In particular, each of resource-specific logic blocks 312-316 are automatically selected from a library of pre-defined resource interconnect cores, whereby the number of resource-specific logic blocks 312-316 that are instantiated within PLD 310 is equal to the number of PCB resources available.

For example, description/constraint files 124 may define a specific number of PCB resources 304-308, e.g., fixed-frequency oscillators, that exist on PCB 302. As such, the number of automatically instantiated resource interconnect cores, such as resource-specific logic blocks 312-316, is equal to the number of fixed-frequency oscillators that are in operation on PCB 302. The input of each automatically instantiated resource-specific logic block is automatically routed to receive an output reference signal from one of the fixed-frequency oscillators. In response, each resource-specific logic block is configured to provide one or more clock output signals that are derived from each respective clock reference signal, such as a 1× and a 2× output clock signal, complementary 1× and 2× output clock signals, phase-offset 1× and 2× output clock signals, etc.

Synthesis tools 140 may then interoperate to identify and route clock signals to the clock signal input pins associated with cores 318-322 that are not represented within netlist 130. That is to say, in other words, that all unconnected clock signal input pins associated with cores 318-322 are automatically routed to compatible clock signal output pins associated with resource-specific logic blocks 312-316. The automatic provisioning of resource-specific logic blocks 312-316, however, may result in a surplus of resource-specific logic blocks instantiated within PLD 310, e.g., resource-specific logic block 312, since the automatic provisioning is resource-based, as opposed to being based upon the clock signal input requirements of cores 318-322.

Figure 4:
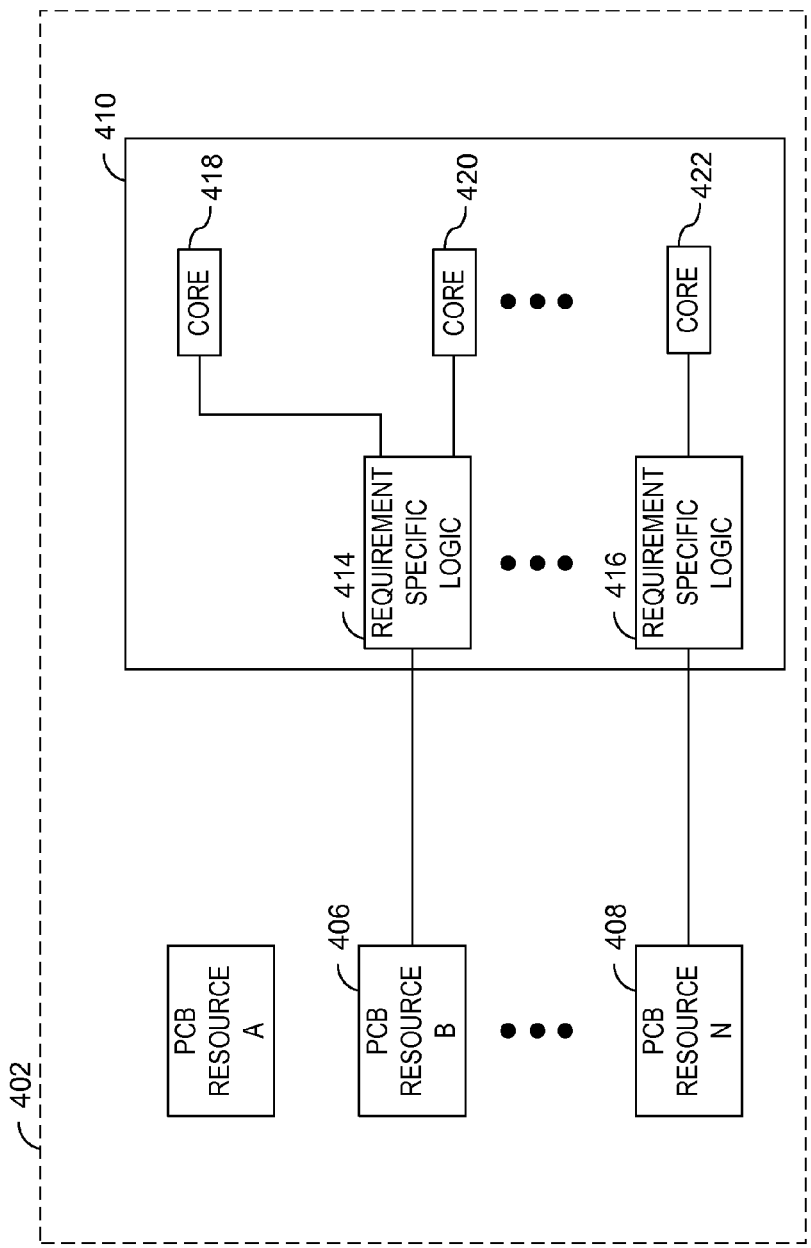
FIG. 4 illustrates an embodiment of a demand-specific, comprehensive PLD design in accordance with the present invention.

Turning to FIG. 4, therefore, an alternate embodiment of a comprehensive PLD design is exemplified in accordance with the present invention, whereby instead of the resource-specific logic blocks of FIG. 3, multiple logic blocks are automatically instantiated within each PLD 410 based upon the resource demands of cores 418-422. In particular, an analysis of the clock input signal requirements of cores 418-422 is conducted by synthesis tools 140. Next, the list of clock signal inputs that are required by cores 418-422 are grouped according to the frequency, phase, stability, and other clock input signal requirements of each core.

Next, the number of requirement-specific logic blocks that are automatically instantiated by synthesis tools 140 includes only the number of requirement-specific logic blocks that are required to accommodate the clock signal input requirements of cores 418-422. As discussed above in relation to FIG. 3, each of requirement-specific logic blocks 414-416 are automatically selected from a library of pre-defined resource interconnect cores. If more than one pre-defined resource interconnect core may accommodate the clock signal input requirements of a particular core 418-422, then synthesis tools 140 assesses each pre-defined resource interconnect core and selects the pre-defined resource interconnect core that achieves the most efficient coverage of clock signal requirements.

For example, if core 418 requires a 50 MHz clock input signal and core 420 requires a 100 MHz clock input signal, then a pre-defined resource interconnect core, such as requirement-specific logic module 414, is instantiated that provides a 1× clock output signal operating at 50 MHz and a 2× clock output signal that operates at 100 MHz. The requisite interconnect is then routed, so that the reference clock input of requirement specific logic module 414 is connected to PCB 402 resource 406, e.g., a fixed-frequency oscillator, and the clock signal outputs of requirement specific logic module 414 are routed to cores 418 and 420 as required. Requirement-specific logic block 416 is similarly instantiated by synthesis tools 140 in accordance with the clock signal input requirements of core 422.

The implementation of FIG. 4 more efficiently utilizes the existing clock signal routing fabric of PLD 410 because only those resource interconnect cores that are required by PLD 410 are actually instantiated, thereby decreasing usage of the existing clock signal routing fabric within PLD 410. The implementation of FIG. 4, however, less efficiently utilizes existing logic within PLD 410, since no analysis of pre-existing clock modules within PLD 410 is conducted.

Figure 5:
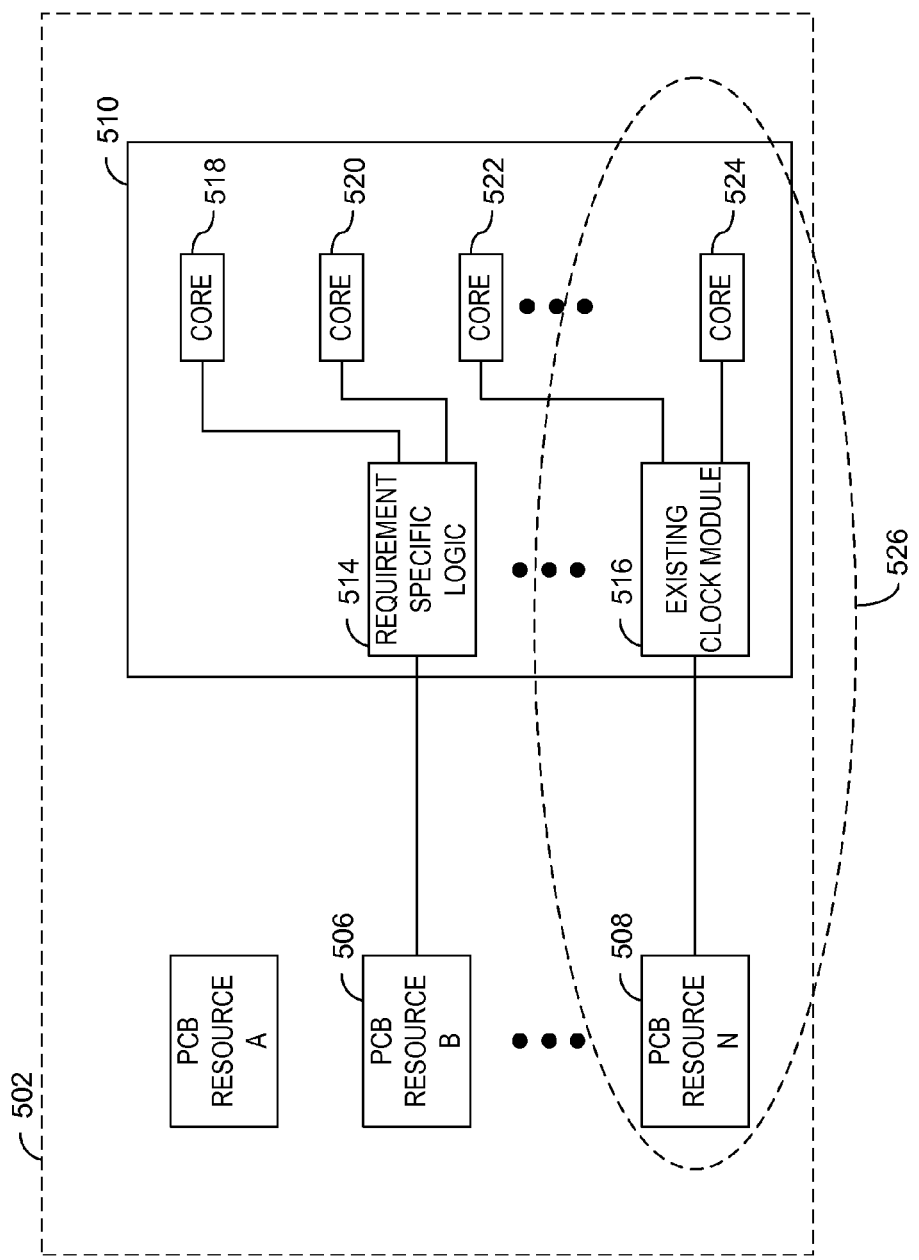
FIG. 5 illustrates an alternate embodiment of a demand-specific, comprehensive PLD design in accordance with the present invention.

Turning to FIG. 5, therefore, an alternate embodiment of a comprehensive PLD design is exemplified in accordance with the present invention, whereby multiple logic blocks are automatically instantiated, but only when pre-existing clock modules within PLD 510 have been identified. In particular, synthesis tools 140 first analyzes PLD 510 to ascertain whether pre-existing clock modules and corresponding interconnect have been instantiated within PLD 510.

For example, pre-existing clock module 516 may have already been manually instantiated, as well as interconnects between clock module 516, PCB 502 resource 508, and core 524 to provide clock signal arrangement 526; while the clock signal input pins of cores 518-522 remain unconnected. If clock module 516 is assessed to accommodate the clock signal input requirements of core 522, the requisite interconnect between core 522 and clock module 516 is then routed. Thus, only the clock signal input requirements of cores 518-520 need be addressed by synthesis tools 140.

In such an instance, the number of requirement-specific logic blocks that are automatically instantiated by synthesis tools 140 avoids unnecessary duplication of clock modules by including only the number of requirement-specific logic blocks that are required to accommodate the clock signal input requirements of cores 518-522. For example, the clock signal input requirements of all cores may be met from pre-existing clock modules, in which case the requisite interconnects are automatically routed. Should the clock signal input requirements of some cores remain unfulfilled, a resource interconnect core, such as requirement-specific logic block 514, is automatically selected from a library of pre-defined resource interconnect cores, as discussed above in relation to FIG. 4. If more than one pre-defined resource interconnect core may accommodate the clock signal input requirements of core 518-522, then synthesis tools 140 assesses each pre-defined resource interconnect core and selects the pre-defined resource interconnect core that achieves the most efficient coverage of clock signal requirements.

For example, if core 518 requires a 100 MHz clock input signal and core 520 requires the complement of the 100 MHz clock input signal, then pre-defined requirement-specific logic module 514 is instantiated from a library of resource interconnect cores that provides a 1× clock output signal operating at 100 MHz and a 1× clock output signal that operates 180 degrees out of phase with the 1× clock output signal operating at 100 MHz. The requisite interconnect is then routed, so that the reference clock input of requirement-specific logic module 514 is connected to PCB resource 506, e.g., a fixed-frequency oscillator, and the clock signal outputs of requirement-specific logic module 514 are routed to cores 518 and 520 as required. Since the clock signal input requirements of cores 518-522 have been adequately addressed, no further action is required of synthesis tools 140.

Figure 6:
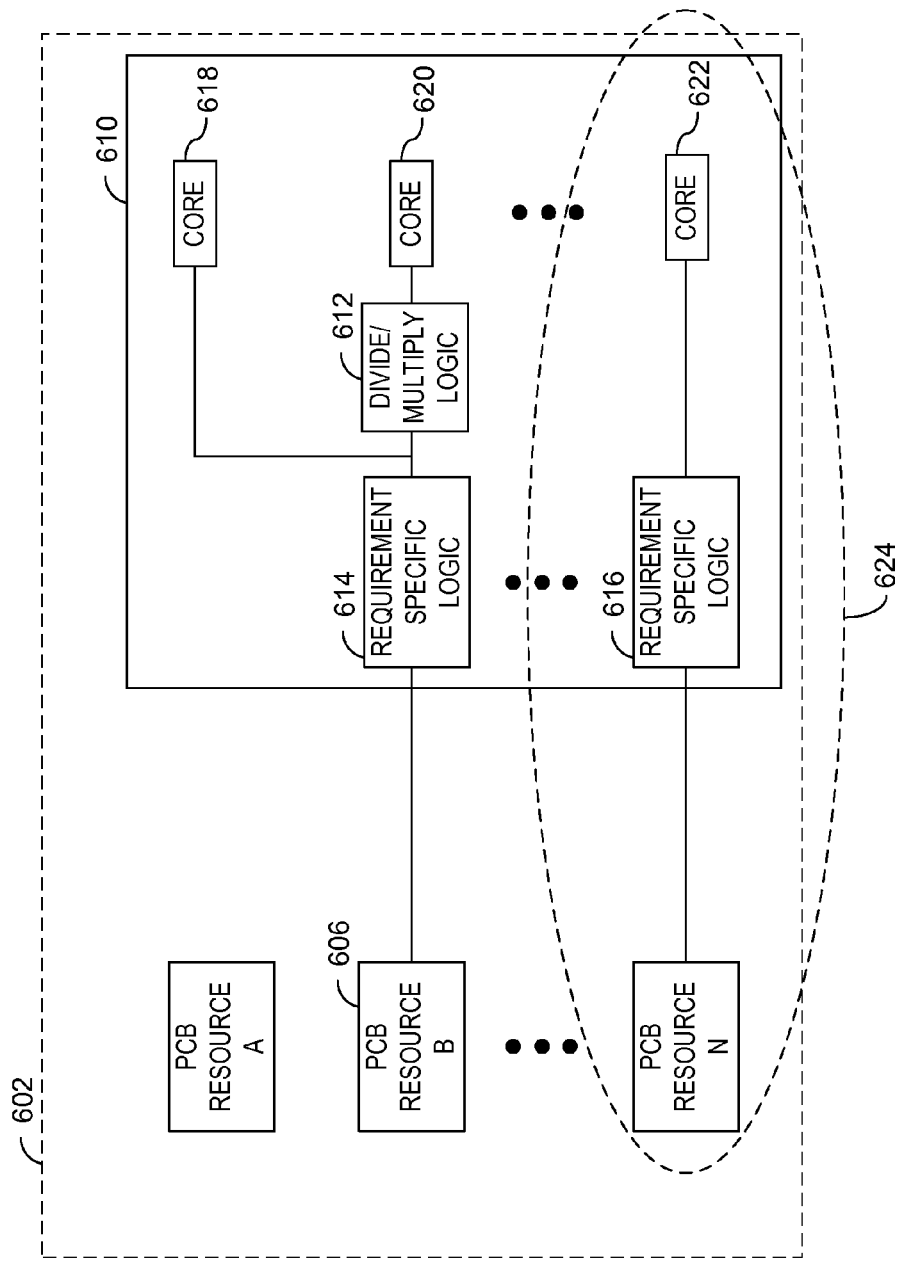
FIG. 6 illustrates an alternate embodiment of a demand-specific, comprehensive PLD design in accordance with the present invention.

Turning to FIG. 6, an alternate embodiment of a comprehensive PLD design is exemplified, whereby multiple logic blocks are automatically instantiated within PLD 610, but clock signal input requirements of certain cores contained within PLD 610 remain unfulfilled. In such instances, clock signal input requirements of one or more cores 618-622 may not frequency align with the clock signal output frequencies that may be provided by the clock modules within the library of resource interconnect cores instantiated by synthesis tools 140. In such instances, an investigation into the frequency division capabilities of the resource interconnect cores within the library is executed by synthesis tools 140.

As discussed above in relation to FIG. 5, clock signal arrangement 624 is first instantiated by synthesis tools 140, whereby a resource interconnect core, such as requirement-specific logic block 616, is automatically selected from a library of resource interconnect cores that achieves the most efficient coverage of clock signal requirements of core 622. Similarly, requirement-specific logic block 614 is automatically selected from a library of resource interconnect cores that achieves the most efficient coverage of clock signal requirements of core 618. Neither of requirement-specific logic block 614, nor requirement-specific logic block 616, however, supplies a fundamental clock signal frequency component that is compatible with the clock signal input requirements of core 620.

For example, PCB 602 resource 606 may represent, e.g., a fixed-frequency oscillator, that provides a 156.25 MHz reference signal that is utilized by a clean-up phase locked loop (PLL) contained within requirement-specific logic block 614 to filter phase jitter and phase noise from the 156.25 MHz reference signal. The filtered 156.25 MHz signal may then be supplied to core 618 to fulfill the clock input signal requirements of core 618. Core 620, however, may require a 125 MHz clock input signal, which is not fundamentally provided by either of requirement-specific logic blocks 614 or 616.

In such an instance, synthesis tools 140 may then investigate the frequency division capability contained within either of requirement-specific logic blocks 614 or 616. Synthesis tools 140 may discover, for example, that divide/multiply logic 612 is automatically instantiated as a resource within requirement-specific logic block 614. As such, synthesis tools 140 may configure divide/multiply logic 612 as a 4/5 divider, to divide the filtered 156.25 MHz signal generated within requirement-specific logic block 614 to provide core 620 with the requisite 125 MHz clock input signal as may be defined by description/constraint files 124.

In general, synthesis tools 140 analyzes relationships between the unresolved clock input signal requirements of cores 618-622, if any, and the available clock modules that may be automatically instantiated from the library of clock module cores available. Should more than one clock module prove sufficient to satisfy the clock input signal requirements of a given core, then a hierarchical priority may be established in accordance with certain selection rules.

For example, if a first core is currently connected to a particular clock module, then a first preference to fulfill the clock input signal requirements of a second core may be to frequency divide the clock signal provided to the first core. If no currently instantiated clock module may suffice to fulfill the clock input signal requirements of the second core, then instantiation of an additional clock module that provides the exact frequency may be preferred over instantiation of a clock module that requires multiplication/division of its clock output signal.

Figure 7:
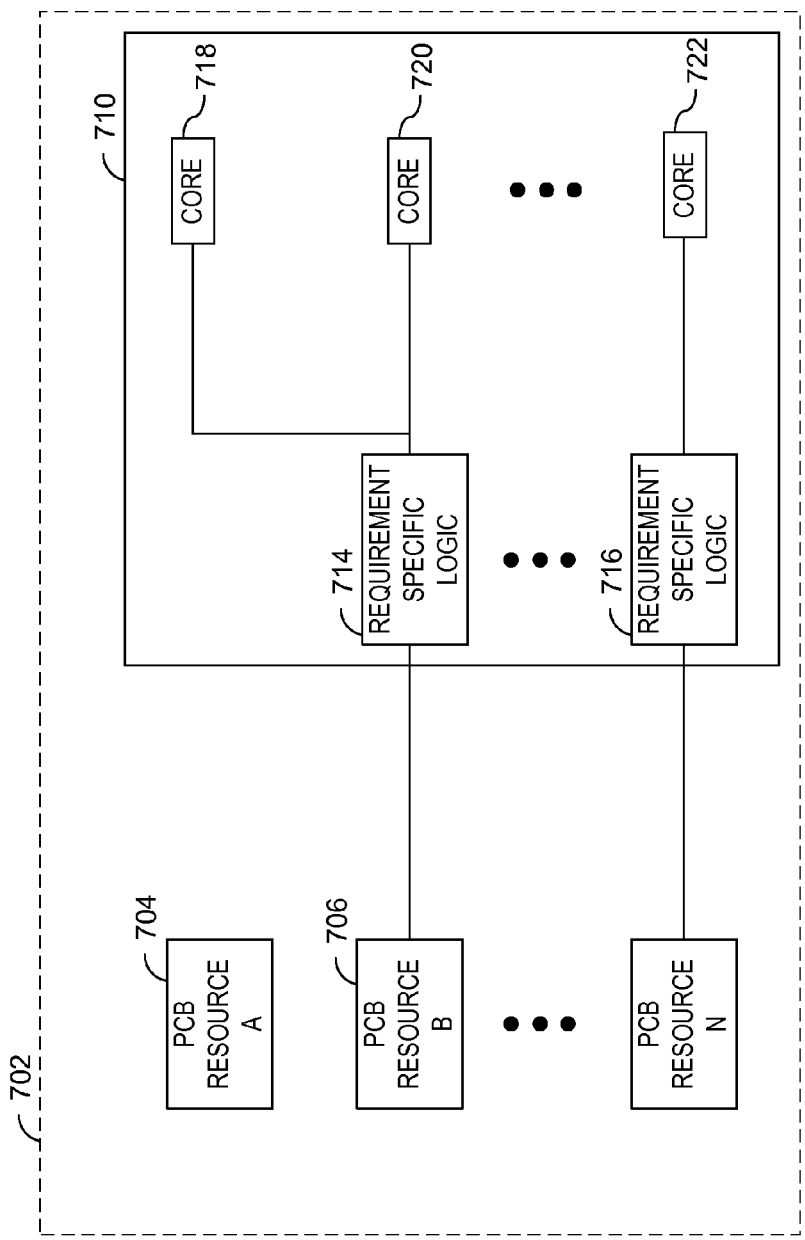
FIG. 7 illustrates an alternate embodiment of a demand-specific, comprehensive PLD design in accordance with the present invention.

Turning to FIG. 7, an alternate embodiment of a comprehensive PLD design is exemplified, whereby multiple logic blocks are automatically instantiated to fulfill the clock input signal requirements of cores that may operate over a range of frequencies. That is to say, in other words, that one or more of cores 718-722 are capable of accepting clock input signals that are not confined to a single frequency, but that may exist within a frequency band.

In such instances, those cores that require a single clock input signal frequency are given top priority by synthesis tools 140. Accordingly, clock signal arrangement(s) are first instantiated by synthesis tools 140, whereby a resource interconnect core, such as requirement-specific logic block 716, is automatically selected from a library of resource interconnect cores that achieves the most efficient coverage of clock signal requirements of core 722.

An attempt is then made by synthesis tools 140 to restrict remaining cores 718-720 to the same clock domain as fixed-frequency core 722. That is to say, for example, that where requirement-specific logic block 716 provides a fixed-frequency clock signal to core 722, top priority is given to provide cores 718-720 with the same fixed-frequency clock signal, if the clock input signal bandwidth requirements of cores 718-720 can be satisfied by such an arrangement.

If requirement-specific logic block 716 cannot provide a clock input signal to cores 718 and 720 that is compliant with the respective clock input signal bandwidth requirements, then the minimum number of clock domains is calculated by synthesis tools 140 to meet the needs of remaining cores 718-720. That is to say, for example, that if core 718 is constrained to accept a 75-150 MHz clock input signal and core 720 is constrained to accept a 50-120 MHz clock input signal, then a resource interconnect core, such as requirement-specific logic block 714, is automatically selected from a library of resource interconnect cores that is capable of providing a clock output signal operating in the 75-120 MHz frequency range. It can be seen, in other words, that the 75-120 MHz clock output signal frequency range provided by requirement-specific logic block 714 is adequate to meet the clock input signal frequency range overlap of cores 718 and 720.

If one of the remaining PCB 702 resources 704-706 is capable of providing a reference signal in the overlapping frequency range, then a clean-up phase locked loop (PLL) contained within requirement-specific logic block 714 may be instantiated to filter phase jitter and phase noise from the reference signal. The filtered reference signal may then be supplied to cores 718-720 to fulfill the clock input signal requirements of cores 718-720. If more than one of the remaining PCB resources 704-706 is capable of providing a reference signal in the overlapping frequency range, then the highest frequency is chosen. Otherwise, the highest frequency in the overlapping frequency range is synthesized by requirement-specific logic block 714 from the reference signal provided by PCB resource 706.

Figure 8:
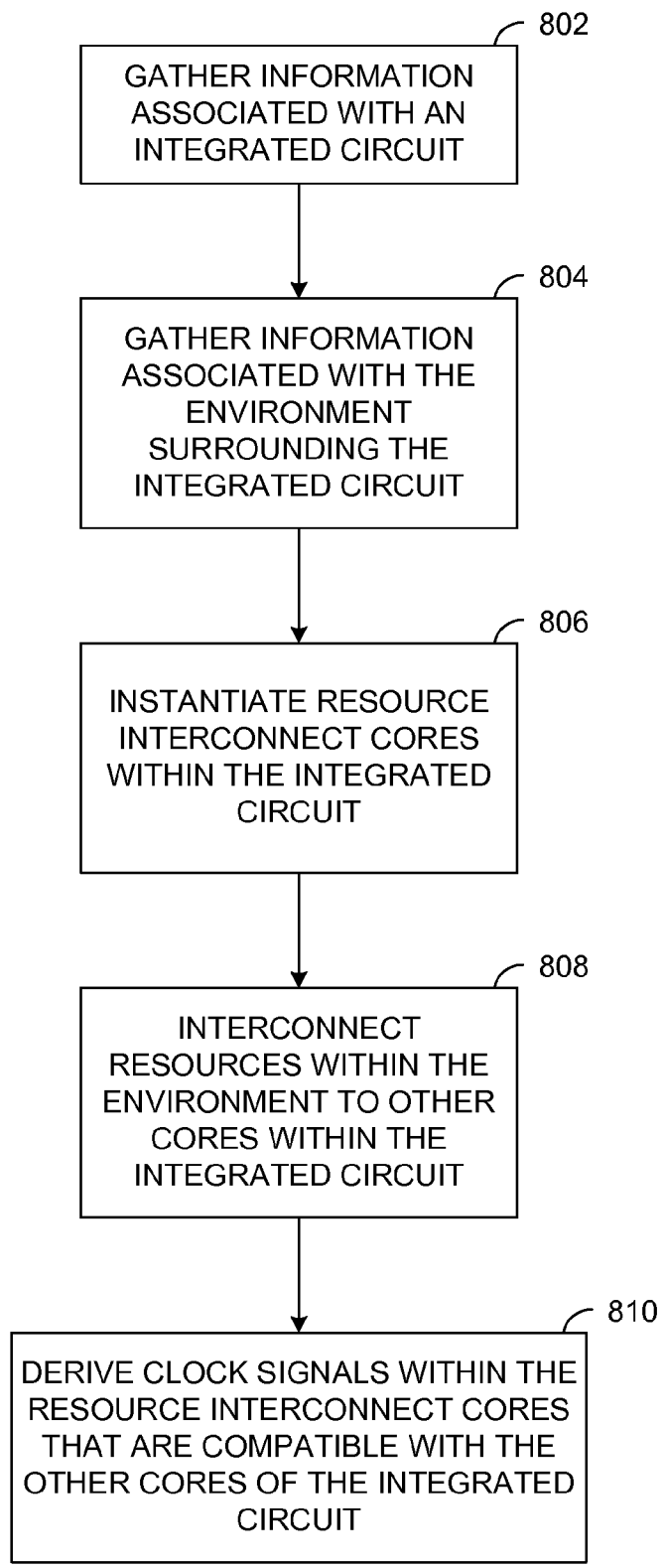
FIG. 8 exemplifies a flow diagram of a method of automating clock signal provisioning within an integrated circuit in accordance with an embodiment of the present invention.

Turning to FIG. 8, a flow diagram of a method of automating clock signal provisioning within an integrated circuit in accordance with an embodiment of the present invention is exemplified. In step 802, information is gathered that is associated with an integrated circuit, such as a PLD of a particular design. Such information, for example, may be derived from hardware design synthesis tools that are concurrently used, for example, to verify a particular hardware design against a particular set of design rules as discussed above in relation to FIG. 1.

In step 804, information is gathered that is associated with the environment that surrounds the PLD. The derived information includes the existence and location of peripheral components, such as fixed-frequency oscillators, that may co-exist with the PLD on the PCB. Other derived information includes details concerning clock modules and cores that may exist within the PLD in accordance with the PLD's design specification as defined by the PLD's hardware description language (HDL).

In step 806, resource interconnect cores are automatically instantiated within the PLD in response to the information gathered in steps 802 and 804. In a first embodiment, as discussed above in relation to FIG. 2 for example, a single PCB-specific logic block may be instantiated within the PLD, where the PCB-specific logic block contains inputs that directly correlate to PCB resources, e.g., fixed-frequency oscillators, that are available on the PCB.

Alternately, a second embodiment as discussed above in relation to FIG. 3, provides for the automatic selection of pre-defined resource interconnect cores, where the number of resource interconnect cores that are instantiated within the PLD is equal to the number of PCB resources available. In an alternate embodiment, as discussed above in relation to FIG. 4, the number of resource interconnect cores instantiated within the PLD instead correlates to the resource requirements as defined for the other cores that exist within the PLD.

Alternate embodiments of step 806, such as discussed above in relation to FIG. 5, allow for the identification of pre-existing clock modules within the PLD before the resource interconnect cores are instantiated. In such an instance, the resource interconnect cores are only instantiated when the resource interconnect cores are needed. Still other embodiments of step 806, such as discussed above in relation to FIG. 6, allow for the investigation of capabilities within previously instantiated resource interconnect cores to facilitate the provisioning of clock signals that comply with the resource requirements as defined for the other cores that exist within the PLD. Yet other embodiments of step 806, as discussed above in relation to FIG. 7, allow for the instantiation of resource interconnect cores to fulfill the clock input signal requirements of the other cores within the PLD that operate over a range of frequencies.

In step 808, interconnections are automatically generated between the PCB resources, such as fixed-frequency oscillators, PLD implemented clock modules, and PLD implemented cores that are contained within the design. Finally, in step 810, the clock signals required by the other cores contained within the PLD are derived by the resource interconnect cores to fulfill the clock input signal requirements of the other cores of the PLD.

Other aspects and embodiments of the present invention will be apparent to those skilled in the art from consideration of the specification and practice of the invention disclosed herein. For example, expansion of the frequency range calculations discussed above may be accomplished to efficiently instantiate clock domains that are sufficient to accommodate the clock input signal needs of cores that are connected in a chain of point-to-point connections. Similarly, expansion of the frequency range calculations discussed above may be accomplished to efficiently instantiate clock domains to accommodate the clock input signal needs of cores that do not exhibit overlapping frequency ranges. It is intended that the specification and illustrated embodiments be considered as examples only, with a true scope and spirit of the invention being indicated by the following claims.

What is claimed is:

1. A method of automating clock signal provisioning within an integrated circuit, the method comprising:
   gathering a first set of information associated with the integrated circuit;
   gathering a second set of information associated with an environment surrounding the integrated circuit;
   instantiating a first set of cores within the integrated circuit that are compatible with the first and second sets of information;
   routing interconnect between the environment, the first set of cores, and a second set of cores contained within the integrated circuit to supply clock signals to the second set of cores; and
   wherein the first set of cores are adapted to derive the clock signals that are compliant with clock signal requirements of the second set of cores;
   wherein instantiating the first set of cores within the integrated circuit comprises automatically selecting a number of pre-defined resource interconnect cores, wherein the number of pre-defined resource interconnect cores selected correlates to the clock signal requirements of the second set of cores.

2. The method of claim 1, wherein gathering the first and second sets of information comprises deriving the first and second sets of information from a hardware design synthesis tool.

3. The method of claim 2, wherein the derived first and second sets of information include the existence and location of printed circuit board resources that co-exist on a printed circuit board with the integrated circuit.

4. The method of claim 3, wherein the printed circuit board resources include fixed-frequency oscillators.

5. The method of claim 3, wherein instantiating the first set of cores within the integrated circuit comprises instantiating printed circuit board specific logic blocks having inputs that directly correlate to the printed circuit board resources.

6. The method of claim 3, wherein the number of pre-defined resource interconnect cores selected is equal to the number of printed circuit board resources available on the printed circuit board.

7. The method of claim 3, wherein the number of pre-defined resource interconnect cores selected correlates to the clock signal requirements of the second set of cores that are not fulfilled by pre-existing resource interconnect cores.

8. The method of claim 7, wherein capabilities of the pre-existing resource interconnect cores are investigated prior to instantiating the pre-defined resource interconnect cores, wherein the investigation determines compatibility between the pre-existing interconnect cores and the clock signal requirements of the second set of cores.

9. The method of claim 8, wherein the clock signal requirements of the second set of cores includes clock signal inputs capable of operating over a range of frequencies.

10. An automated clock signal provisioning system, comprising:
   a processor adapted to synthesize automatic clock signal routing within an integrated circuit by performing functions including,
      gathering a first set of information associated with the integrated circuit;
      gathering a second set of information associated with an environment surrounding the integrated circuit;
      instantiating a first set of cores within the integrated circuit that are compatible with the first and second sets of information;
      routing interconnect between the environment, the first set of cores, and a second set of cores contained within the integrated circuit to supply clock signals to the second set of cores; and
      wherein the first set of cores is adapted to derive the clock signals that are compliant with clock signal requirements of the second set of cores;
      wherein instantiating the first set of cores within the integrated circuit comprises automatically selecting a number of pre-defined resource interconnect cores, wherein the number of pre-defined resource interconnect cores selected correlates to the clock signal requirements of the second set of cores.

11. The automated clock signal provisioning system of claim 10, wherein gathering the first and second sets of information comprises deriving the first and second sets of information from description and constraint files accessed by the processor, the first and second sets of information including the existence and location of printed circuit board resources that co-exist on a printed circuit board with the integrated circuit.

12. The automated clock signal provisioning system of claim 11, wherein instantiating the first set of cores within the integrated circuit comprises instantiating printed circuit board specific logic blocks having inputs that directly correlate to the printed circuit board resources.

13. The automated clock signal provisioning system of claim 11, wherein the number of pre-defined resource interconnect cores selected is equal to the number of printed circuit board resources available on the printed circuit board.

14. The automated clock signal provisioning system of claim 11, wherein the number of pre-defined resource interconnect cores selected correlates to the clock signal requirements of the second set of cores that are not fulfilled by pre-existing resource interconnect cores.

15. The automated clock signal provisioning system of claim 14, wherein capabilities of the pre-existing resource interconnect cores are investigated prior to instantiating the pre-defined resource interconnect cores, wherein the investigation determines compatibility between the pre-existing interconnect cores and the clock signal requirements of the second set of cores.

16. The automated clock signal provisioning system of claim 15, wherein the clock signal requirements of the second set of cores includes clock signal inputs capable of operating over a range of frequencies.

17. An automatic clock provisioning method, comprising:
   gathering information associated with an integrated circuit from description and constraint files contained within a hardware design synthesis tool utilized to synthesize the integrated circuit;
   gathering information associated with an environment surrounding the integrated circuit from the description and constraint files;
   instantiating resource interconnect cores within the integrated circuit in response to the description and constraint files; and
   deriving clock signals within the instantiated resource interconnect cores that are compatible with other cores existing within the integrated circuit;
   wherein instantiating the resource interconnect cores within the integrated circuit comprises automatically selecting a number of pre-defined resource interconnect cores, wherein the number of pre-defined resource interconnect cores selected correlates to the clock signal requirements of the other cores existing within the integrated circuit.

18. The automatic clock provisioning method of claim 17, further comprising automatically interconnecting the resource interconnect cores to the other cores existing within the integrated circuit to provide clock signals to the other cores.

* * * * *